(12) United States Patent
Luo

(10) Patent No.: US 11,453,691 B2
(45) Date of Patent: Sep. 27, 2022

(54) METHOD FOR PREPARING SENSITIZING MATERIAL AND ORGANIC LIGHT EMITTING DIODE

(71) Applicant: Wuhan China Star Optoelectronics Semiconductor Display Technology Co., Ltd., Wuhan (CN)

(72) Inventor: Jiajia Luo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 466 days.

(21) Appl. No.: 16/490,898

(22) PCT Filed: Jan. 17, 2019

(86) PCT No.: PCT/CN2019/072159
§ 371 (c)(1),
(2) Date: Sep. 4, 2019

(87) PCT Pub. No.: WO2020/107685
PCT Pub. Date: Jun. 4, 2020

(65) Prior Publication Data
US 2020/0181180 A1      Jun. 11, 2020

(30) Foreign Application Priority Data

Nov. 26, 2018 (CN) .......................... 201811415628.2

(51) Int. Cl.
*C07F 9/6568* (2006.01)
*H01L 51/00* (2006.01)
(Continued)

(52) U.S. Cl.
CPC ...... *C07F 9/65685* (2013.01); *H01L 51/0071* (2013.01); *H01L 51/0094* (2013.01);
(Continued)

(58) Field of Classification Search
CPC ............. C07F 9/65685; C07F 9/65683; C07F 9/6596; C07F 9/6568; H01L 51/0094;
(Continued)

(56) References Cited

U.S. PATENT DOCUMENTS 4,066,804 A     1/1978  Andrews
2018/0312533 A1*  11/2018  Ahn ................. H01L 51/5004

FOREIGN PATENT DOCUMENTS

CA          939989      1/1974
CN        106831874     6/2017
(Continued)

OTHER PUBLICATIONS

Yang et al. "A Phosphanthrene Oxide Host With Close Sphere Packing for Ultralow-Voltage-Driven Efficient Blue Thermally Activated Delayed Fluorescence Diodes", Advanced Materials. 29(38): 1700553-1-1700553-9, Published Online Aug. 21, 2017.

*Primary Examiner* — Michael Y Sun

(57) ABSTRACT

A method for preparing a sensitizing material and an organic light emitting diode are provided, the method including: adding $C_{24}H_{16}Br_2P_2$ and dichloromethane to a hydrogen peroxide solution to react therewith, dissolving a reactant in a dichloromethane solution and subjecting the solution to a purification with a first silica gel column; adding a purified product, a predetermined electron donor material, palladium acetate, and tri-tert-butylphosphine tetrafluoroborate in sodium tert-butoxide and toluene to react; extracting with dichloromethane and purified by a second silica gel column.

16 Claims, 2 Drawing Sheets

(51) Int. Cl.
*H01L 51/52* (2006.01)
*C09K 11/06* (2006.01)
*C07F 9/6596* (2006.01)
*H01L 51/50* (2006.01)

(52) U.S. Cl.
CPC ........ *H01L 51/5212* (2013.01); *C07F 9/6568* (2013.01); *C07F 9/6596* (2013.01); *C07F 9/65683* (2013.01); *C09K 11/06* (2013.01); *C09K 2211/104* (2013.01); *C09K 2211/1007* (2013.01); *C09K 2211/1029* (2013.01); *C09K 2211/1096* (2013.01); *H01L 51/0067* (2013.01); *H01L 51/0072* (2013.01); *H01L 51/5028* (2013.01)

(58) Field of Classification Search
CPC ............. H01L 51/5212; H01L 51/0071; H01L 51/5028; H01L 51/0067; H01L 51/0072; C09K 11/06; C09K 2211/1007; C09K 2211/1029; C09K 2211/104; C09K 2211/1096
See application file for complete search history.

(56) References Cited

FOREIGN PATENT DOCUMENTS

| CN | 106831874 A | * | 6/2017 | ............ C07F 9/5728 |
| CN | 108794533 | | 11/2018 | |

* cited by examiner

METHOD FOR PREPARING SENSITIZING MATERIAL AND ORGANIC LIGHT EMITTING DIODE

RELATED APPLICATIONS

This application is a National Phase of PCT Patent Application No. PCT/CN2019/072159 having International filing date of Jan. 17, 2019, which claims the benefit of priority of Chinese Patent Application No. 201811415628.2 filed on Nov. 26, 2018. The contents of the above applications are all incorporated by reference as if fully set forth herein in their entirety.

FIELD AND BACKGROUND OF THE INVENTION

The present invention relates to the field of display technologies, and in particular, to a method for preparing a sensitizing material and an organic light emitting diode.

In organic light emitting diodes (OLEDs), luminescent material plays a dominant and critical role. One luminescent material used in early OLEDs was a fluorescent material. Because a ratio of excitons in a singlet state and triplet state is 1:3 in the OLEDs, the theoretical internal quantum efficiency (IQE) of the OLEDs based on the fluorescent material can only reach 25%, which greatly limits application of fluorescent electroluminescent devices.

A pure organic thermally activated delayed fluorescent (TADF) material has a small minimum singlet-triplet energy level difference ($\Delta EST$) by its ingenious molecular design, such that triplet excitons can return to a singlet state by reverse intersystem crossing (RISC) and then illuminated by the radiation transition from a high energy level state to a ground state, so that the singlet and triplet excitons can be utilized simultaneously, and 100% theoretical internal quantum efficiency (IQE) can be achieved.

However, the existing thermally activated delayed fluorescent (TADF) material has a very wide spectrum due to its stronger charge transfer characteristics, which result in a poor color gamut when applied in a field of blue light, which greatly limits its development.

Ordinary blue fluorescence has a very narrow spectrum but is limited by that the theoretical internal quantum efficiency can only reach 25%. In addition, the blue phosphorescent material has poor stability and a short service life, which reduces the service life of an organic light emitting diode.

Therefore, it is necessary to provide a method for preparing a sensitizing material and an organic light emitting diode to solve the problems existing in the prior art.

SUMMARY OF THE INVENTION

An object of the present invention is to provide a method for preparing a sensitizing material and an organic light emitting diode, which can improve the internal quantum efficiency, the service life, and the color gamut of the organic light emitting diode.

In order to solve the above technical problems, the present invention provides a method for preparing a sensitizing material, including: adding $C_{24}H_{16}Br_2P_2$ and dichloromethane to a hydrogen peroxide solution to react therewith to obtain a first reaction solution, and filtering the first reaction solution to obtain a solid; dissolving the solid in a dichloromethane solution and subjecting the solution to a purification process with a first silica gel column to obtain an intermediate; mixing the intermediate, a predetermined electron donor material, palladium acetate and tri-tert-butylphosphine tetrafluoroborate to obtain a mixed solution; the predetermined electron donor material comprises at least one of 9,10-dihydro-9,9-dimethylacridine, 9,10-dihydro-9,9-diphenylacridine and 9,10-dihydro-9,9-diphenylsilylacridine; placing the mixed solution in a glove box, and adding sodium tert-butoxide and toluene to the mixed solution to react therewith to obtain a second reaction solution; and extracting the second reaction solution with dichloromethane to obtain an extract and subjecting the extract to a purification process with a second silica gel column to obtain a sensitizing material; wherein a structural formula of the sensitizing material is

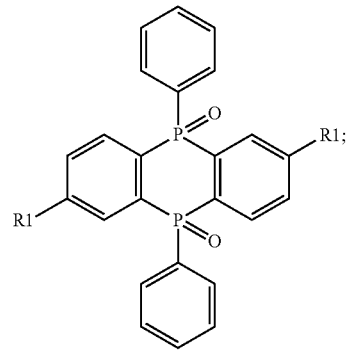

wherein R1 is a substituent, and R1 comprises at least one of the following structural formulas:

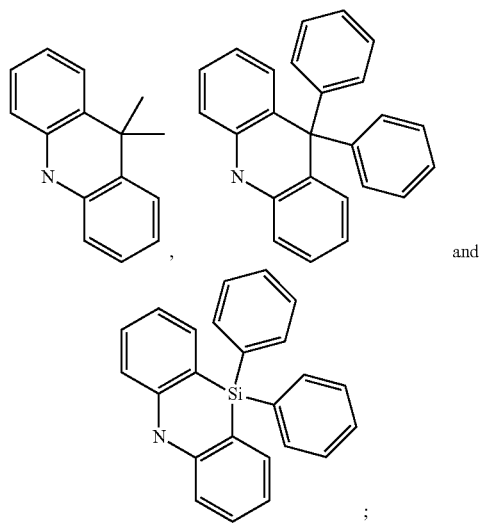

the second silica gel column comprises dichloromethane and n-hexane, and the volume ratio of the dichloromethane to the n-hexane in the second silica gel column is 1:1 to 3:1.

In the preparation method of the sensitizing material of the present invention, the first silica gel column includes dichloromethane and n-hexane, and the volume ratio of the dichloromethane to the n-hexane in the first silica gel column is 3:2.

In the preparation method of the sensitizing material of the present invention, the intermediate has a weight ranging from 1.5 g to 5 g and a molar amount ranging from 3 mmol to 7 mmol.

In the preparation method of the sensitizing material of the present invention, the predetermined electron donor material has a weight ranging from 0.5 g to 2 g and a molar amount ranging from 4 mmol to 8 mmol.

In the preparation method of the sensitizing material of the present invention, the palladium acetate has a weight ranging from 20 mg to 60 mg and a molar amount ranging from 0.01 mmol to 0.4 mmol.

In the preparation method of the sensitizing material of the present invention, the tri-tert-butylphosphine tetrafluoroborate has a weight ranging from 0.01 g to 0.5 g and a molar amount ranging from 0.2 mmol to 0.9 mmol.

In the preparation method of the sensitizing material of the present invention, the sodium tert-butoxide has a weight ranging from 0.2 g to 0.8 g and a molar amount ranging from 3 mmol to 9 mmol.

The invention provides a preparation method of a sensitizing material, including: adding $C_{24}H_{16}Br_2P_2$ and dichloromethane to a hydrogen peroxide solution to react therewith to obtain a first reaction solution, and filtering the first reaction solution to obtain a solid; dissolving the solid in a dichloromethane solution and subjecting the solution to a purification process with a first silica gel column to obtain an intermediate; mixing the intermediate, a predetermined electron donor material, palladium acetate and tri-tert-butylphosphine tetrafluoroborate to obtain a mixed solution; the predetermined electron donor material comprises at least one of 9,10-dihydro-9,9-dimethylacridine, 9,10-dihydro-9,9-diphenylacridine and 9,10-dihydro-9,9-diphenylsilylacridine; placing the mixed solution in a glove box, and adding sodium tert-butoxide and toluene to the mixed solution to react therewith to obtain a second reaction solution; and extracting the second reaction solution with dichloromethane to obtain an extract and subjecting the extract to a purification process with a second silica gel column to obtain a sensitizing material.

In the preparation method of the sensitizing material of the present invention, the structural formula of the sensitizing material is:

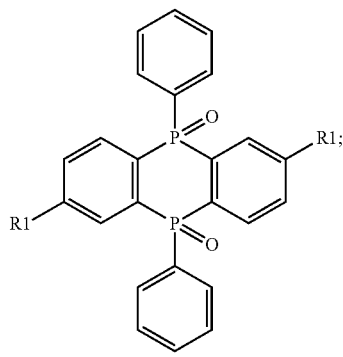

wherein R1 is a substituent, and R1 comprises at least one of the following structural formulas:

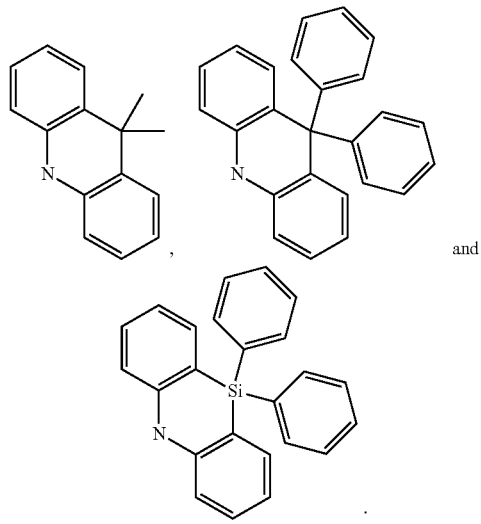

In the preparation method of the sensitizing material of the present invention, the first silica gel column comprises dichloromethane and n-hexane, the volume ratio of the dichloromethane to the n-hexane in the first silica gel column is 3:2.

In the preparation method of the sensitizing material of the present invention, the second silica gel column comprises dichloromethane and n-hexane, the volume ratio of the dichloromethane to the n-hexane in the second silica gel column is 1:1 to 3:1.

In the preparation method of the sensitizing material of the present invention, the intermediate has a weight ranging from 1.5 g to 5 g and a molar amount ranging from 3 mmol to 7 mmol.

In the preparation method of the sensitizing material of the present invention, the predetermined electron donor material has a weight ranging from 0.5 g to 2 g and a molar amount ranging from 4 mmol to 8 mmol.

In the preparation method of the sensitizing material of the present invention, the palladium acetate has a weight ranging from 20 mg to 60 mg and a molar amount ranging from 0.01 mmol to 0.4 mmol.

In the preparation method of the sensitizing material of the present invention, the tri-tert-butylphosphine tetrafluoroborate has a weight ranging from 0.01 g to 0.5 g and a molar amount ranging from 0.2 mmol to 0.9 mmol.

In the preparation method of the sensitizing material of the present invention, the sodium tert-butoxide has a weight ranging from 0.2 g to 0.8 g and a molar amount ranging from 3 mmol to 9 mmol.

The invention also provides an organic light emitting diode including: an anode layer, a light emitting layer and a cathode layer, wherein the light emitting layer comprises a sensitizing material, and a structural formula of the sensitizing material is:

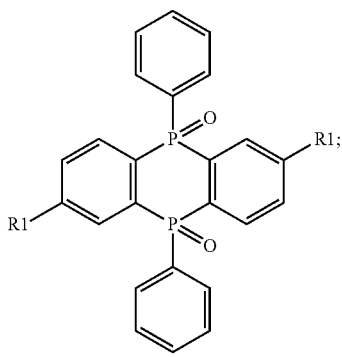

wherein R1 is a substituent, and R1 comprises at least one of the following structural formulas:

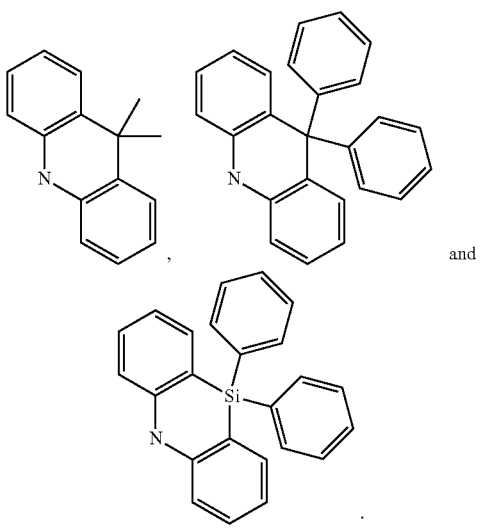

In the organic light emitting diode of the present invention, the material of the light emitting layer further comprises bis[2-[(oxo)diphenylphosphino]phenyl]ether (DPEPD) and a fluorescent material.

In the organic light emitting diode of the present invention, the material of the cathode layer comprises lithium fluoride and aluminum.

In the organic light emitting diode of the present invention, the material of the anode layer is indium tin oxide.

Beneficial Effect

The preparation method of the sensitizing material of the invention and the organic light emitting diode widen the color gamut by preparing a new sensitizing material when applied in a blue light field. It also improves internal quantum efficiency and lifespan of the organic light-emitting diodes.

BRIEF DESCRIPTION OF THE SEVERAL VIEWS OF THE DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DESCRIPTION OF SPECIFIC EMBODIMENTS OF THE INVENTION

Figure 1:
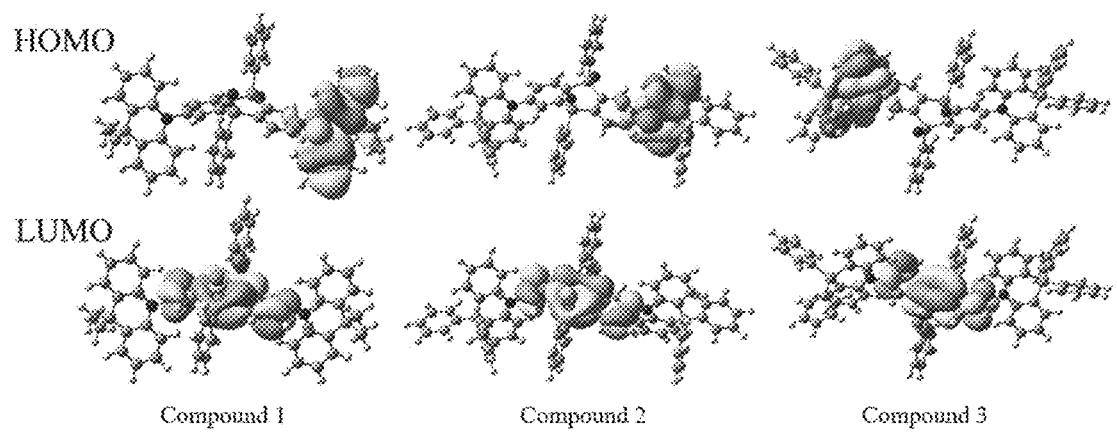
FIG. 1 is a schematic diagram showing the distribution of a highest electron occupied orbital and a lowest electron unoccupied orbital of compounds 1 to 3 of the present invention.

The following description of the embodiments is provided to illustrate the specific embodiments of the invention. The directional terms mentioned in the present invention, such as "on," "below", "front", "behind", "left", "right", "inside", "outside", "side", etc., are merely references of the direction in the drawings. Therefore, the directional terminology used is for the purpose of illustration and understanding of the invention rather than limiting the invention. In the drawings, the structurally similar elements are denoted by the same reference numerals.

A preparation method of a sensitizing material of the present invention includes:

S101, adding $C_{24}H_{16}Br_2P_2$ and dichloromethane to a hydrogen peroxide solution to react therewith to obtain a first reaction solution, and filtering the first reaction solution to obtain a solid; for example, in one embodiment, adding 5.24 g and a molar amount of 10 mmol of $C_{24}H_{16}Br_2P_2$, 60 ml of dichloromethane (DCM) and 10 ml, 30% of the hydrogen peroxide solution to a two-neck flask having a capacity of 100 ml, and then reacted at room temperature for 24 hours to obtain the first reaction solution. Following, the first reaction solution is poured into 200 ml of ice water, and filtered to obtain an off-white solid.

S102, the solid is dissolved in dichloromethane, and purified with a first silica gel column to obtain an intermediate. For example, in one embodiment, the off-white solid is dissolved with dichloromethane and separated and purified by the first silica gel column to obtain an intermediate. The intermediate is a white powder (weight: 5.1 g and the yield of the intermediate is 92%). The first silica gel column includes dichloromethane and n-hexane, and the volume ratio of the dichloromethane to the n-hexane is 3:2.

The simplified chemical equation of S101 and S102 above is as follows:

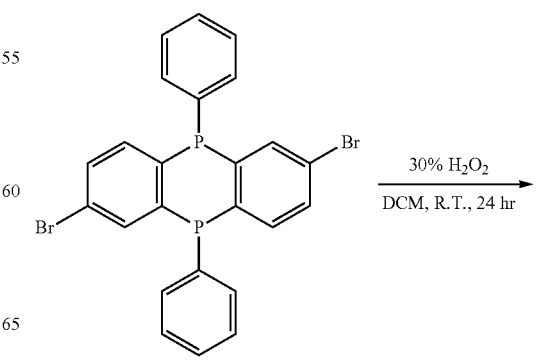

-continued

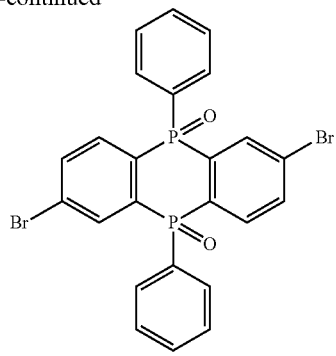

wherein R.T. represents room temperature and the chemical structural formula of $C_{24}H_{16}Br_2P_2$ is:

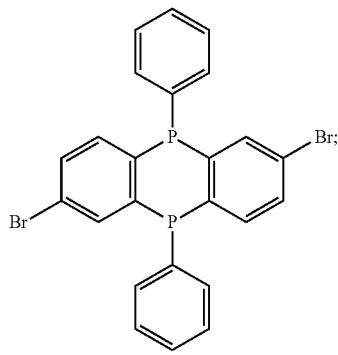 [SMILES: Brc1ccc2c(c1)P(c1ccccc1)c1ccc(Br)cc1P2c1ccccc1]

wherein the chemical formula of the intermediate is $C_{24}H_{16}Br_2O_2P_2$, and the chemical structural formula is:

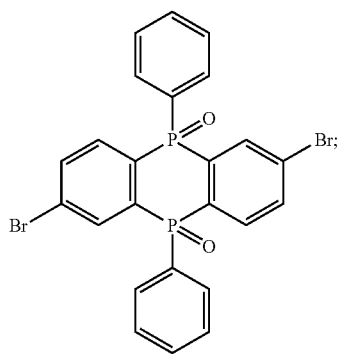 [SMILES: O=P1(c2ccccc2)c2ccc(Br)cc2P(=O)(c2ccccc2)c2ccc(Br)cc21]

S103, mixing the intermediate, a predetermined electron donor material, palladium acetate, and tri-tert-butylphosphine tetrafluoroborate to obtain a mixed solution; wherein the predetermined electron donor material includes at least one of 9,10-dihydro-9,9-dimethylacridine, 9,10-dihydro-9,9-diphenylacridine, and 9,10-dihydro-9,9-diphenylsilylacridine. For example, the intermediate, the predetermined electron donor material, palladium acetate, and tri-tert-butylphosphine tetrafluoroborate are mixed in a two-neck flask to obtain a mixed solution.

The intermediate has a weight ranging from 1.5 g to 5 g and a molar amount ranging from 3 mmol to 7 mmol.

The predetermined electron donor material has a weight ranging from 0.5 g to 2 g and a molar amount ranging from 4 mmol to 8 mmol.

The palladium acetate has a weight ranging from 20 mg to 60 mg and a molar amount ranging from 0.01 mmol to 0.4 mmol.

The tri-tert-butylphosphine tetrafluoroborate has a weight ranging from 0.01 g to 0.5 g and a molar amount ranging from 0.2 mmol to 0.9 mmol.

S104, placing the mixed solution in a glove box, and adding sodium tert-butoxide and toluene to the mixed solution to react therewith to obtain a second reaction solution. For example, the two-neck flask containing the mixed solution is placed in a glove box. Working gas of the glove box is argon, and the glove box is pre-placed with sodium tert-butoxide and dehydrated and deaerated toluene, the mixed solution is reacted with sodium tert-butoxide and toluene in the glove box to obtain a second reaction solution.

S105, extracting the second reaction solution with dichloromethane to obtain an extract and subjecting the extract to a purification process with a second silica gel column to obtain a sensitizing material. For example, the second reaction solution is subjected to multiple extractions with dichloromethane, and an organic phase is combined and purified by a second silica gel column to obtain a sensitizing material. The sensitizing material includes at least one of $C_{54}H_{44}N_2O_2P_2$, $C_{74}H_{52}N_2O_2P_2$, and $C_{72}H_{52}N_2O_2P_2Si_2$. The second silica gel column includes dichloromethane and n-hexane, and the volume ratio of the dichloromethane to the n-hexane is 1:1 to 3:1.

The above-mentioned steps S103-S105 include the following embodiments:

EMBODIMENT 1

2.80 g and a molar amount of 5 mmol of the intermediate, 1.14 g and a molar amount of 6 mmol of 9,10-dihydro-9,9-dimethylacridine, 45 mg and a molar amount of 0.2 mmol of palladium acetate ($Pd(OAc)_2$) and 0.17 g and a molar amount of 0.6 mmol of tri-tert-butylphosphine tetrafluoroborate are separately added into a two-neck flask having a capacity of 100 ml and mixed. After that, the two-neck flask is placed in a glove box, working gas of the glove box is argon. 0.58 g and a molar amount of 6 mmol of sodium tert-butoxide (NaOt-Bu) is added in advance to the glove box, and 40 ml of toluene dehydrated and deaerated is injected, the mixed solution in the above-mentioned two-neck flask and sodium tert-butoxide and toluene in the glove box are reacted therewith at a temperature of 120° C. for 48 hours to obtain a second reaction solution. The second reaction solution is cooled to room temperature, and then the second reaction solution is poured into 50 ml of ice water, and extracted three times with dichloromethane, following the organic phase is combined and purified by silica gel column to obtain a blue-white powder sensitizing material. (i.e., compound 1). The compound 1 has a weight of 1.5 g and a yield of 37%. The volume ratio of dichloromethane to n-hexane in the column is 2:1.

The chemical equation of embodiment 1 is as follows:

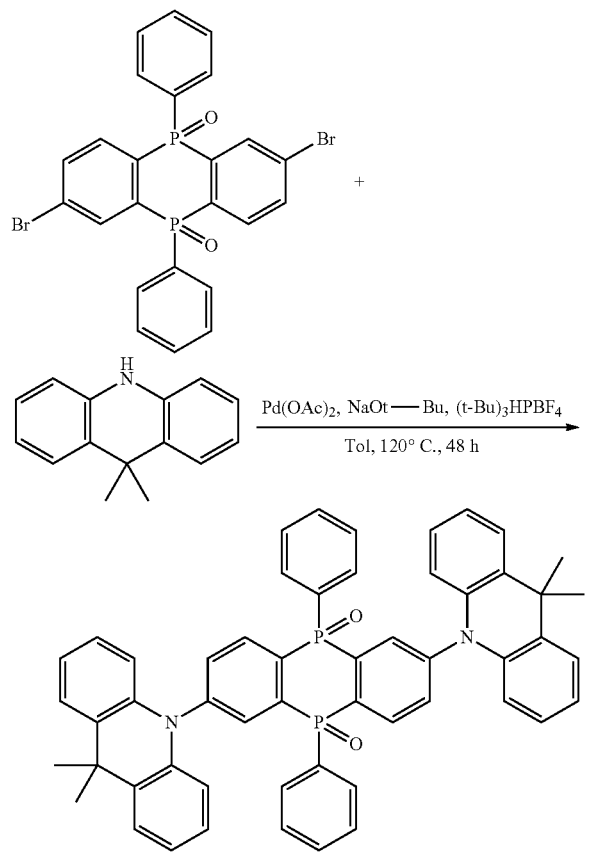

The compound 1 has the chemical formula of $C_{54}H_{44}N_2O_2P_2$, and its structural formula is:

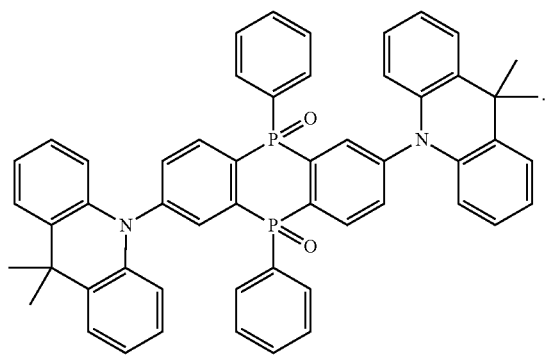

The chemical formula of 9,10-dihydro-9,9-dimethylacridine is $C_{15}H_{15}N$, and its structural formula is:

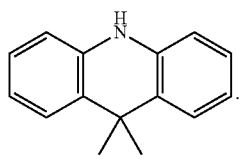 [SMILES: CC1(C)c2ccccc2Nc2ccccc21]

TOL is an abbreviation for toluene.

EMBODIMENT 2

2.80 g and a molar amount of 5 mmol of intermediate, 2 g and a molar amount of 6 mmol of 9,10-dihydro-9,9-diphenylacridine, 45 mg and a molar amount of 0.2 mmol of palladium acetate ($Pd(OAc)_2$), and 0.17 g and a molar amount of 0.6 mmol of tri-tert-butylphosphine tetrafluoroborate ($(t-Bu)_3HPBF_4$) are separately added into a two-neck flask having a capacity of 100 ml and mixed. After that, the two-neck flask is placed in a glove box, working gas of the glove box is argon. 0.58 g and a molar amount of 6 mmol of sodium tert-butoxide (NaOt-Bu) is added in advance to the glove box, and 40 ml of toluene dehydrated and deaerated is injected, the mixed solution in the above-mentioned two-neck flask and sodium tert-butoxide and toluene in the glove box are reacted therewith at a temperature of 110° C. for 24 hours to obtain a second reaction solution. The second reaction solution is cooled to room temperature, and then the second reaction solution is poured into 200 ml of ice water, and extracted three times with dichloromethane, following the organic phase is combined and purified by silica gel column to obtain a pale blue powder sensitizing material. (i.e., compound 2). The compound 2 has a weight of 2.3 g and a yield of 43%. The volume ratio of dichloromethane to n-hexane in the column is 1:1.

The chemical equation of embodiment 2 is as follows:

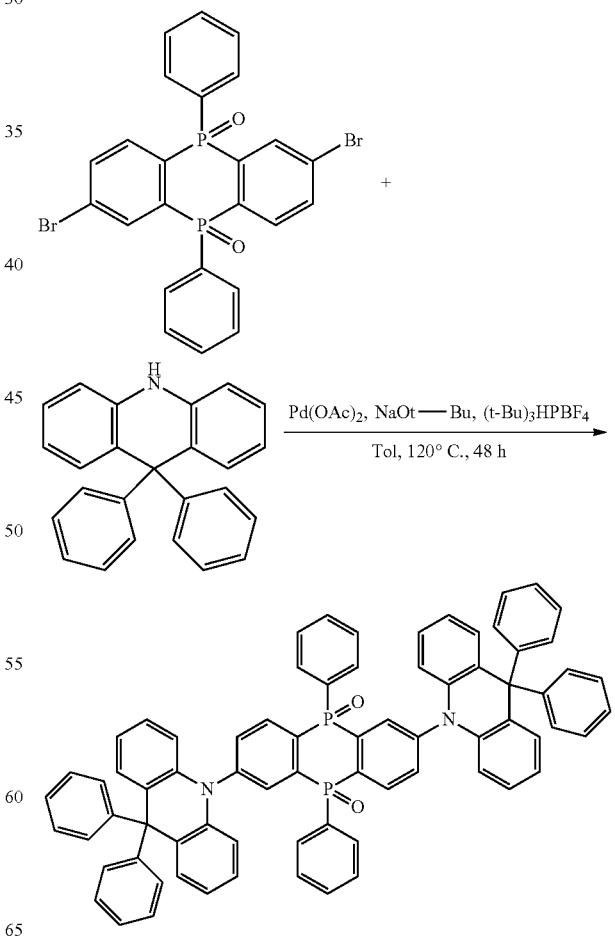

The compound 2 has the chemical formula of $C_{74}H_{52}N_2O_2P_2$, and its structural formula is:

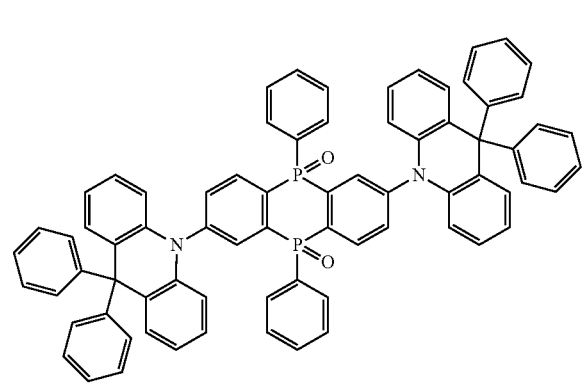 [SMILES: O=P1(c2ccccc2)c2ccc(N3c4ccccc4C(c4ccccc4)(c4ccccc4)c4ccccc43)cc2P(=O)(c2ccccc2)c2ccc(N3c4ccccc4C(c4ccccc4)(c4ccccc4)c4ccccc43)cc21]

The chemical formula of 9,10-dihydro-9,9-diphenylacridine is $C_{25}H_{19}N$, and its structural formula is:

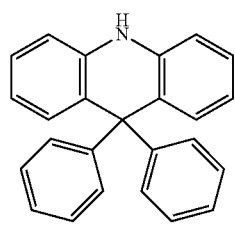 [SMILES: c1ccc(C2(c3ccccc3)c3ccccc3Nc3ccccc32)cc1]

EMBODIMENT 3

2.80 g and a molar amount of 5 mmol of intermediate, 2 g and a molar amount of 6 mmol of 9,10-dihydro-9,9-diphenylsilylacridine, 45 mg and a molar amount of 0.2 mmol of palladium acetate ($Pd(OAc)_2$), and 0.17 g and a molar amount of 0.6 mmol of tri-tert-butylphosphine tetrafluoroborate ($(t-Bu)_3HPBF_4$) are separately added into a two-neck flask having a capacity of 100 ml and mixed. After that, the two-neck flask is placed in a glove box, working gas of the glove box is argon. 0.58 g and a molar amount of 6 mmol of sodium tert-butoxide (NaOt-Bu) is added in advance to the glove box, and 40 ml of toluene dehydrated and deaerated is injected, the mixed solution in the above-mentioned two-neck flask and sodium tert-butoxide and toluene in the glove box are reacted therewith at a temperature of 110° C. for 24 hours to obtain a second reaction solution. The second reaction solution is cooled to room temperature, and then the second reaction solution is poured into 200 ml of ice water, and extracted three times with dichloromethane, following the organic phase is combined and purified by silica gel column to obtain a pale blue powder sensitizing material. (i.e., compound 3). The compound 3 has a weight of 2.2 g and a yield of 40%. The volume ratio of dichloromethane to n-hexane in the column is 2:1.

The chemical equation of embodiment 3 is as follows:

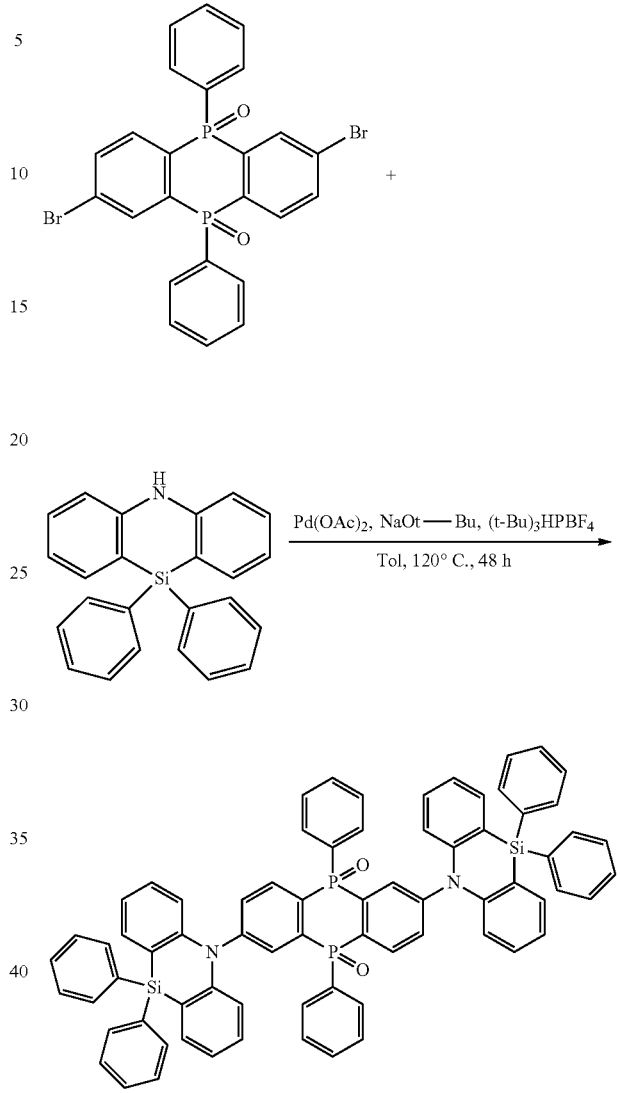

The compound 3 has the chemical formula of $C_{72}H_{52}N_2O_2P_2Si_2$, and its structural formula is:

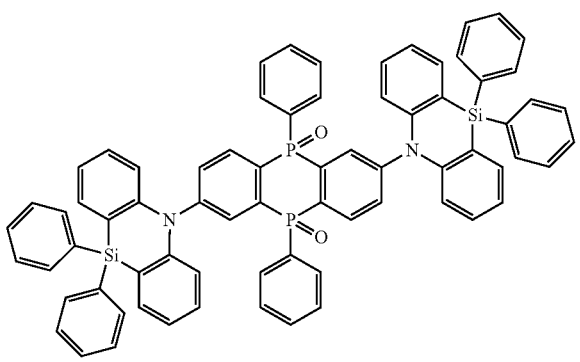 [SMILES: O=P1(c2ccccc2)c2ccc(N3c4ccccc4[Si](c4ccccc4)(c4ccccc4)c4ccccc43)cc2P(=O)(c2ccccc2)c2ccc(N3c4ccccc4[Si](c4ccccc4)(c4ccccc4)c4ccccc43)cc21]

The chemical formula of 9,10-dihydro-9,9-diphenylsilylacridine is $C_{25}H_{19}NSi$, and its structural formula is:

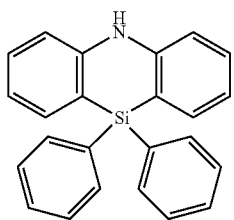 [SMILES: c1ccc([Si]2(c3ccccc3)c3ccccc3Nc3ccccc32)cc1]

In summary, the chemical structure of the above sensitizing material is:

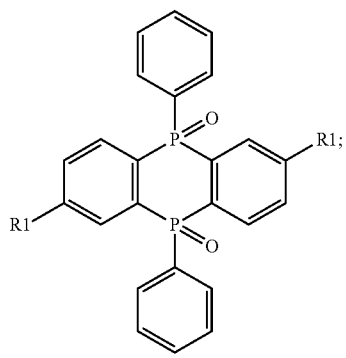

R1 is a substituent, and R1 includes at least one of the following chemical formulas:

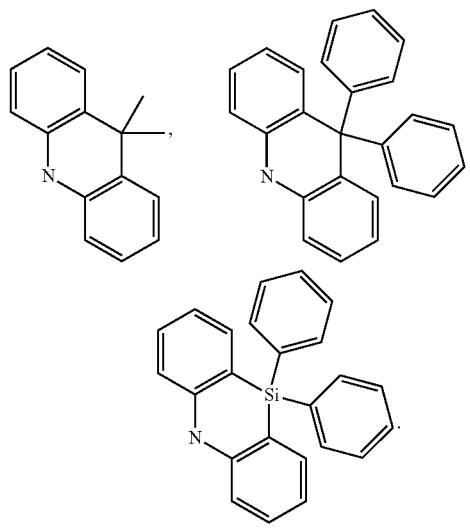

As shown in FIG. 1, distribution of the highest occupied molecular orbital (HOMO) and the lowest unoccupied molecular orbital (LUMO) of the compounds 1 to 3 are given. The structure of the first row in the figure represents the HOMO of the compounds 1 to 3, respectively, and the structure of the second row in the figure represents the LUMO of the compounds 1 to 3, respectively. It is not difficult to observe that the HOMO and LUMO orbitals of the compounds 1 to 3 are denser; the denser the orbitals, the farther the distance of the orbitals center is, results in stronger charge transfer characteristics.

The lowest singlet level (S1) and lowest triplet level (T1) and electrochemical energy level of compounds 1 to 3 are shown in Table 1:

TABLE 1

|  | PL Peak (nm) | $S_1$ (eV) | $T_1$ (eV) | $\Delta E_{ST}$ (eV) | HOMO (eV) | LUMO (eV) |
| --- | --- | --- | --- | --- | --- | --- |
| Compound 1 | 447 | 2.77 | 2.73 | 0.04 | −5.49 | −1.73 |
| Compound 2 | 420 | 2.95 | 2.90 | 0.05 | −5.37 | −1.72 |
| Compound 3 | 417 | 2.98 | 2.91 | 0.07 | −5.39 | −1.71 |

Figure 2:
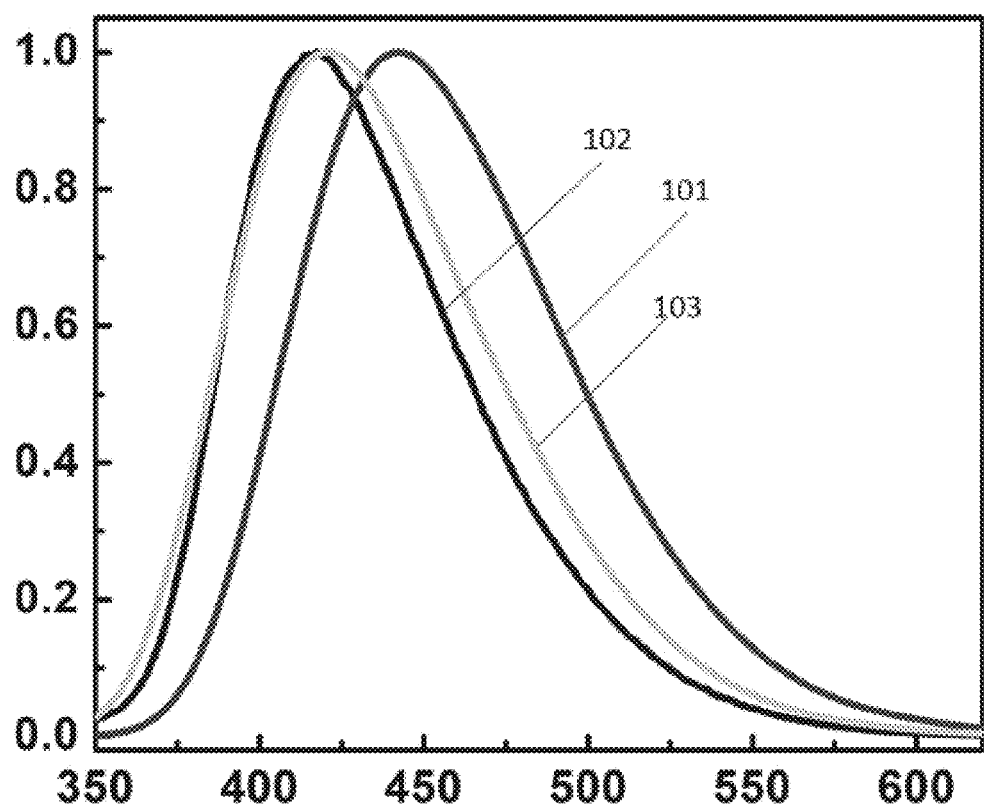
FIG. 2 is a photoluminescence spectrum of the compounds 1 to 3 in a toluene solution of the present invention.

As shown in FIG. 2, the photoluminescence spectra of compounds 1 to 3 in a toluene solution at room temperature are given. In FIG. 2, the abscissa represents the wavelength in nm, and the ordinate represents the normalized intensity (dimensionless), wherein 101 represents the spectrum of compound 1, 102 represents the spectrum of compound 2, and 103 represents the spectrum of compound 3. It can be observed that the spectra of the compounds 1 to 3 are narrow and the color gamut is good, and the spectrum is blue, the energy level is high.

Figure 3:
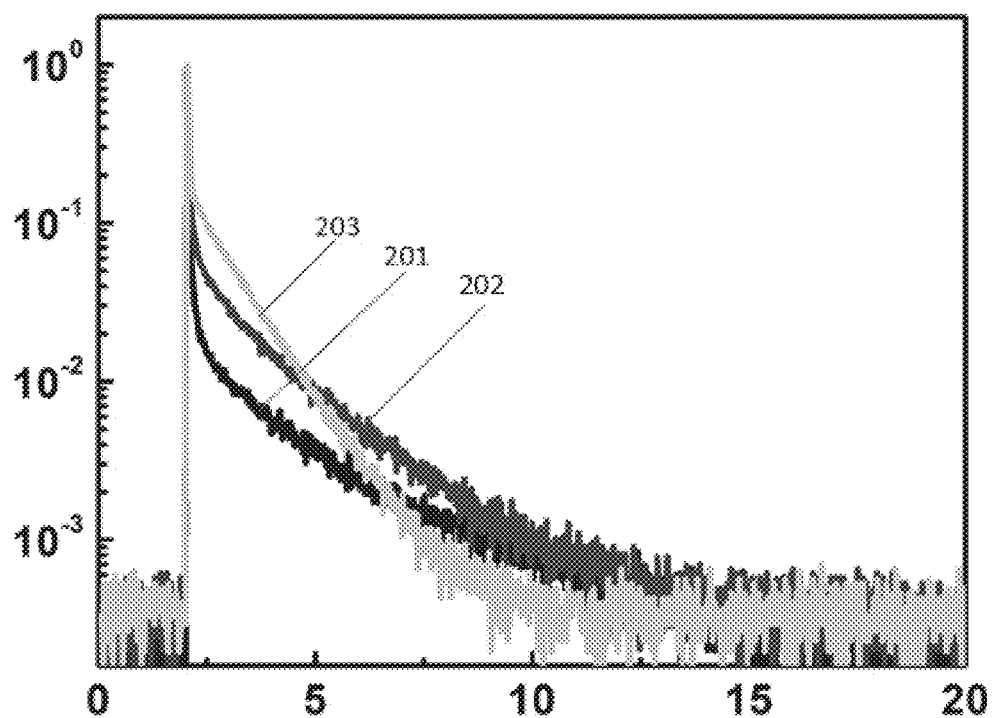
FIG. 3 is a transient photoluminescence spectrum of the compounds 1 to 3 in a toluene solution of the present invention.

As shown in FIG. 3, transient photoluminescence spectra of compounds 1 to 3 in a toluene solution at room temperature are shown. 201-203 represents the transient spectra of compounds 1 to 3, respectively. The transient luminescence spectrum affects the luminescence lifespan of the materials. It can be observed that the luminescence lifespans of the compounds 1 to 3 are relatively low, and the lower the lifespan of the luminescent material, the better the life of the device to be fabricated. Moreover, the luminescence lifespans of the compounds 1 to 3 are sequentially lowered, and thus the lifespan of the prepared device is longer. It can be observed that the sensitizing material prepared by the invention has thermally activated delayed fluorescent (TADF) characteristics, and the internal quantum efficiency is high and the color gamut is wide.

Generally, thermally activated delayed fluorescent (TADF) materials have a molecular structure in which an electron donor and an electron acceptor are combined. Due to the difference in electron donors (the present invention includes the electron donors of $C_{15}H_{15}N$, $C_{25}H_{19}N$, and $C_{25}H_{19}NSi$), their ability to provide electrons are different and their configurations are different, the present invention regulates a twist angle and charge transfer characteristics between an electron donor and an electron acceptor (double phosphorus-oxygen as an intermediate nuclear electron acceptor) by screening different electron donor units to achieve the purpose of reducing the lowest single triple energy level difference and high energy level of the target molecule, so that the above sensitizing material has an ultra-fast reverse intersystem crossing rate.

In addition, the preparation method of the present invention synthesizes a series of high energy level thermally activated delayed fluorescent (TADF) sensitizing materials having a high TADF ratio and high photoluminescence quantum yield (PLQY). Doping the sensitizing material in the luminescent layer and sensitizing the blue fluorescence can increase the internal quantum efficiency of the organic light emitting diode to 100% while the spectrum of the device is narrow, enabling the application of a wide color gamut.

Figure 4:
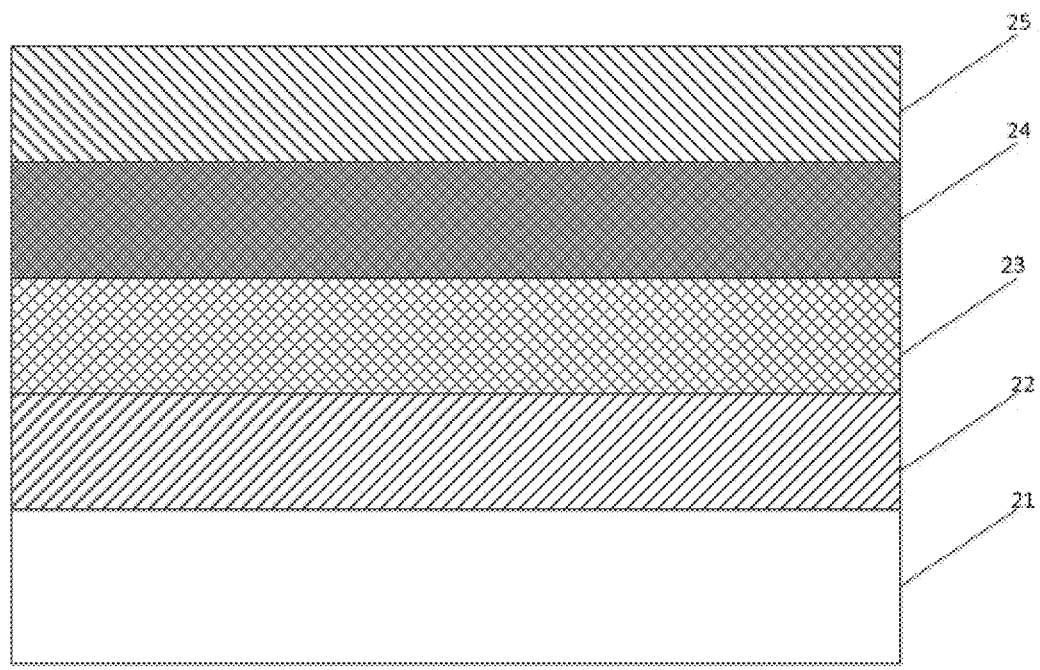
FIG. 4 is a schematic structural diagram of an organic light emitting diode of the present invention.

As shown in FIG. 4, the present invention further provides an organic light emitting diode including an anode 22, a light emitting layer 23, and a cathode 25, wherein material of the light emitting layer 23 includes the above sensitizing material. The material of the light-emitting layer includes bis[2-

[(oxo)diphenylphosphino]phenyl]ether (DPEPD) having a molecular formula of $C_{36}H_{28}O_3P_2$, a sensitizing material, and a fluorescent material. The fluorescent material is preferably a blue fluorescent material. Material of the anode 22 is indium tin oxide (ITO).

The organic light emitting diode of the present invention may further include a glass substrate 21, a hole transport layer, an injection layer 22, and an electron transport layer 24, material of the hole transport layer includes poly (3,4-ethylenedioxythiophene) or polystyrene sulfonate. The first material of the hole injection layer includes a mixed solution of PEDOT: PSS. Material of the electron transport layer 24 includes 1,3,5-tris(3-(3-pyridyl)phenyl)benzene/Tm3PyPB. Material of the cathode layer 25 includes lithium fluoride and aluminum.

The method for preparing an organic light emitting diode includes sequentially spin coating of PESOT: PSS material and a light emitting layer material on a cleaned conductive glass (indium tin oxide), and then sequentially depositing TmPyPB, LiF and Al under high vacuum conditions.

The organic light-emitting diodes 1 to 3 are obtained by the method using the compounds 1 to 3, hereinafter referred to as devices 1 to 3. The specific structures of the above devices are as follows:

The thicknesses of the anode and the hole injection layer are 50 nm, the thickness of the light-emitting layer is 40 nm, the thickness of the electron transport layer 24 is 40 nm, the thickness of LiF in the cathode layer is 1 nm, and the thickness of Al is 100 nm, the thickness ratio of DPEPO: Compound 1:PAA in the light-emitting layer is 8:1.5:0.5.

Material of the light-emitting layer in the device 1 includes DPEPO:compound 1:PAA. Material of the light-emitting layer in device 2 includes DPEPO:compound 2:PAA. Material of the light-emitting layer in device 3 includes DPEPO:compound 3:PAA. The performance data of devices 1 to 3 are shown in Table 2:

TABLE 2

| Device | Maximum luminance (cd/m²) | High current efficiency (cd/A) | CIEy | Maximum external quantum efficiency (%) |
|---|---|---|---|---|
| Device 1 | 1123 | 21.3 | 0.15 | 17.9 |
| Device 2 | 1534 | 25.4 | 0.09 | 20.4 |
| Device 3 | 1983 | 24.5 | 0.08 | 19.8 |

It can be observed that a series of high performance dark blue fluorescent organic light emitting diodes (OLEDs) are prepared by doping the above sensitizing material into the material of the light emitting layer. The current-luminance-voltage characteristics of the device are performed by a Keithley source measurement system (Keithley 2400 Sourcemeter, Keithley 2000 Currentmeter) with a calibrated silicon photodiode. The electroluminescence spectrum is measured by a French JY SPEX CCD3000 spectrometer, and all measurements are performed at room temperature in the atmosphere.

The preparation method of the sensitizing material of the present invention and the organic light emitting diode expand the color gamut when applied in the field of blue light by preparing a new sensitizing material, and improve the internal quantum efficiency and the service life of the organic light emitting diode.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A method of preparing a sensitizing material, comprising:

adding $C_{24}H_{16}Br_2P_2$ and dichloromethane to a hydrogen peroxide solution to react therewith to obtain a first reaction solution, and filtering the first reaction solution to obtain a solid;

dissolving the solid in a dichloromethane solution and subjecting the dichloromethane solution with the solid dissolved therein to a purification process through a first silica gel column to obtain an intermediate;

mixing the intermediate, a predetermined electron donor material, palladium acetate, and tri-tert-butylphosphine tetrafluoroborate to obtain a mixed solution, wherein the predetermined electron donor material comprises at least one of 9,10-dihydro-9,9-dimethylacridine, 9,10-dihydro-9,9-diphenylacridine, and 9,10-dihydro-9,9-diphenylsilyl acridine;

placing the mixed solution in a glove box, and adding sodium tert-butoxide and toluene to the mixed solution to react therewith to obtain a second reaction solution; and extracting the second reaction solution with dichloromethane to obtain an extract and subjecting the extract to a purification process with a second silica gel column to obtain the sensitizing material;

wherein a structural formula of the sensitizing material is:

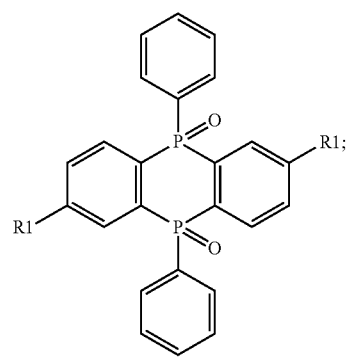

wherein R1 is a substituent, and R1 comprises at least one of the following structural formulas:

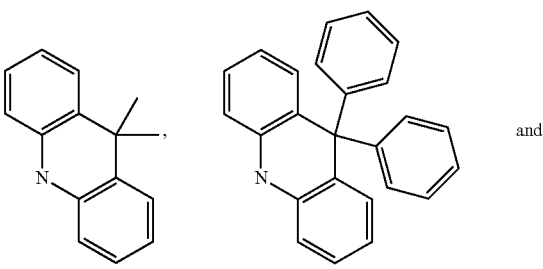

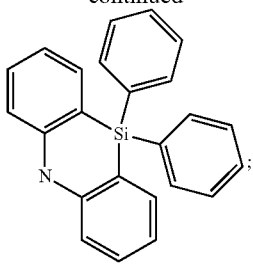

and
wherein the second silica gel column comprises dichloromethane and n-hexane, and a volume ratio of the dichloromethane to the n-hexane in the second silica gel column is 1:1 to 3:1.

2. The method of preparing the sensitizing material according to claim 1, wherein the first silica gel column comprises dichloromethane and n-hexane, and a volume ratio of the dichloromethane to the n-hexane in the first silica gel column is 3:2.

3. The method of preparing the sensitizing material according to claim 1, wherein the intermediate has a weight ranging from 1.5 g to 5 g and a molar amount ranging from 3 mmol to 7 mmol.

4. The method of preparing the sensitizing material according to claim 1, wherein the predetermined electron donor material has a weight ranging from 0.5 g to 2 g and a molar amount ranging from 4 mmol to 8 mmol.

5. The method of preparing the sensitizing material according to claim 1, wherein the palladium acetate has a weight ranging from 20 mg to 60 mg and a molar amount ranging from 0.01 mmol to 0.4 mmol.

6. The method of preparing the sensitizing material according to claim 1, wherein the tri-tert-butylphosphine tetrafluoroborate has a weight ranging from 0.01 g to 0.5 g and a molar amount ranging from 0.2 mmol to 0.9 mmol.

7. The method of preparing the sensitizing material according to claim 1, wherein the sodium tert-butoxide has a weight ranging from 0.2 g to 0.8 g and a molar amount ranging from 3 mmol to 9 mmol.

8. A method of preparing a sensitizing material, comprising:
adding $C_{24}H_{16}Br_2P_2$ and dichloromethane to a hydrogen peroxide solution to react therewith to obtain a first reaction solution, and filtering the first reaction solution to obtain a solid;
dissolving the solid in a dichloromethane solution and subjecting the dichloromethane solution with the solid dissolved therein to a purification process through a first silica gel column to obtain an intermediate;
mixing the intermediate, a predetermined electron donor material, palladium acetate, and tri-tert-butylphosphine tetrafluoroborate to obtain a mixed solution;
wherein, the predetermined electron donor material comprises at least one of 9,10-dihydro-9,9-dimethylacridine, 9,10-dihydro-9,9-diphenylacridine, and 9,10-dihydro-9,9-diphenylsilyl acridine;
placing the mixed solution in a glove box, and adding sodium tert-butoxide and toluene to the mixed solution to react therewith to obtain a second reaction solution; and
extracting the second reaction solution with dichloromethane to obtain an extract and subjecting the extract to a purification process with a second silica gel column to obtain the sensitizing material.

9. The method of preparing the sensitizing material according to claim 8, wherein the structural formula of the sensitizing material is:

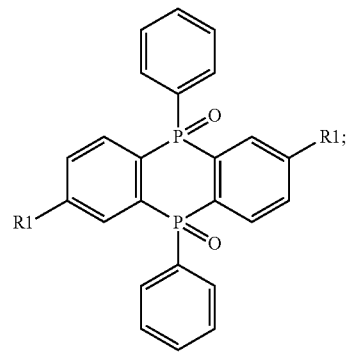

wherein R1 is a substituent, and R1 comprises at least one of the following structural formulas:

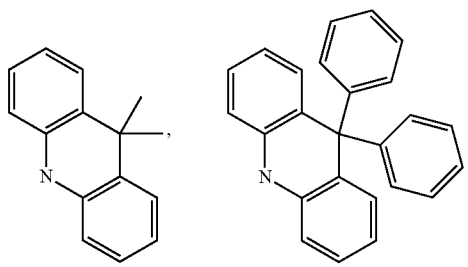

and

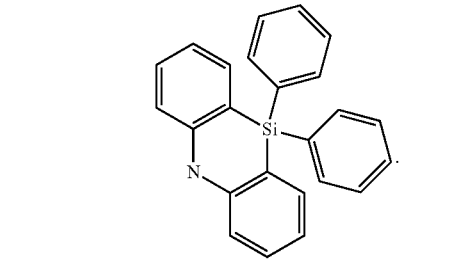

10. The method of preparing the sensitizing material according to claim 8, wherein the first silica gel column comprises dichloromethane and n-hexane, a volume ratio of the dichloromethane to the n-hexane in the first silica gel column is 3:2.

11. The method of preparing the sensitizing material according to claim 8, wherein the second silica gel column comprises dichloromethane and n-hexane, a volume ratio of the dichloromethane to the n-hexane in the second silica gel column is 1:1 to 3:1.

12. The method of preparing the sensitizing material according to claim 8, wherein the intermediate has a weight ranging from 1.5 g to 5 g and a molar amount ranging from 3 mmol to 7 mmol.

13. The method of preparing the sensitizing material according to claim 8, wherein the predetermined electron donor material has a weight ranging from 0.5 g to 2 g and a molar amount ranging from 4 mmol to 8 mmol.

14. The method of preparing the sensitizing material according to claim 8, wherein the palladium acetate has a weight ranging from 20 mg to 60 mg and a molar amount ranging from 0.01 mmol to 0.4 mmol.

15. The method of preparing the sensitizing material according to claim 8, wherein the tri-tert-butylphosphine tetrafluoroborate has a weight ranging from 0.01 g to 0.5 g and a molar amount ranging from 0.2 mmol to 0.9 mmol.

16. The method of preparing the sensitizing material according to claim 8, wherein the sodium tert-butoxide has a weight ranging from 0.2 g to 0.8 g and a molar amount ranging from 3 mmol to 9 mmol.

\* \* \* \* \*